United States Patent
Wu

(10) Patent No.: US 8,350,373 B2
(45) Date of Patent: Jan. 8, 2013

(54) CHIP STACKED STRUCTURE AND METHOD OF FABRICATING THE SAME

(75) Inventor: Ming-Che Wu, Nantou County (TW)

(73) Assignees: Universal Scientific Industrial (Shanghai) Co., Ltd., Shanghai (CN); Universal Global Scientific Industrial Co., Ltd., Nantou County (TW)

(*) Notice: Subject to any disclaimer, the term of this patent is extended or adjusted under 35 U.S.C. 154(b) by 0 days.

(21) Appl. No.: 13/072,951

(22) Filed: Mar. 28, 2011

(65) Prior Publication Data
US 2012/0074593 A1    Mar. 29, 2012

(30) Foreign Application Priority Data
Sep. 27, 2010  (TW) ............................... 99132581 A

(51) Int. Cl.
*H01L 23/02* (2006.01)
(52) U.S. Cl. ............... 257/686; 257/777; 257/E25.006; 257/E25.021; 257/E25.027; 257/E23.085; 438/109
(58) Field of Classification Search ............ 257/777, 257/E23.01, E21.499, E25.005, E25.006, 257/E25.021, E25.027, E23.085
See application file for complete search history.

(56) References Cited

U.S. PATENT DOCUMENTS

| | | | | |
|---|---|---|---|---|
| 6,528,870 | B2* | 3/2003 | Fukatsu et al. | 257/685 |
| 7,875,973 | B2* | 1/2011 | Chiu | 257/723 |
| 7,919,846 | B2* | 4/2011 | Hembree | 257/686 |
| 7,939,947 | B2* | 5/2011 | Kwon et al. | 257/777 |
| 8,008,126 | B2* | 8/2011 | Jeung et al. | 438/109 |
| 2004/0124523 | A1* | 7/2004 | Poo et al. | 257/698 |
| 2010/0320597 | A1* | 12/2010 | Lee et al. | 257/737 |

* cited by examiner

*Primary Examiner* — Jasmine Clark
(74) *Attorney, Agent, or Firm* — Rosenberg, Klein & Lee

(57) ABSTRACT

A chip stacked structure and method of fabricating the same are provided. The chip stacked structure includes a first chip and a second chip stacked on the first chip. The first chip has a plurality of metal pads disposed on an upper surface thereof and grooves disposed on a side surface thereof. The metal pads are correspondingly connected to upper openings of the grooves. The second chip has a plurality of grooves on a side surface of the second chip, locations of which are corresponding to that of the grooves on the side surface of the first chip. Conductive films are formed on the grooves of the first chip and the second chip and the metal pads to electronically connect the first chip and second chip. The chip stacked structure may simplify the process and improve the process yield rate.

6 Claims, 6 Drawing Sheets

CHIP STACKED STRUCTURE AND METHOD OF FABRICATING THE SAME

BACKGROUND OF THE INVENTION

1. Field of the Invention

The present invention relates to a chip stacked structure, and more particularly, to a stack chip stacked structure.

2. Description of Related Art

With process technologies of integrated circuit (IC) develop rapidly, the integration density of a chip inner circuit increases and an area for the conductive lines decreases. With the reduction of the area of pads and metal wires, continuous improvements of the chip stacked technology are required to adapt for more miniaturized chip.

The popularity of the high-end cell phones drives the demand of high-capacity memory wherein the high-capacity memory applied to the high-end cell phones requires high-capacity and small volume, so that traditional chip structure can not satisfy the requirements thereof completely. The 3D stacked structure technology stacks chips and then connects the stacked chips, which increases over two times density on same chip and becomes the main technique for solving high-density memory presently. However, the stacked chip structure has to connect the stacked chips, a more complex process and lower yield, and is disadvantageous to mass-production.

SUMMARY OF THE INVENTION

The present invention provides a chip stacked structure having metal pads formed on the chip for connection. Then, conductive films are formed on grooves on the side surface of the chip and the metal pads by using chemical plating technology so as to connect stacked chips. By this way, the stacked chips can be connected to each other rapidly and the process yield is improved.

The present invention is directed to a chip stacked structure comprising a first chip and a second chip. The first chip has a first groove and a first metal pad, wherein the first groove is fondled on a side surface of the first chip and the first metal pad is formed on an upper surface of the first chip and connected to the upper opening of the first groove. The second chip is stacked on the second chip and has a second groove disposed on a side surface of the second chip, wherein the first groove is disposed corresponding to the second groove so as to form a connection groove, and a conductive film is formed on the connection groove and the first metal pad so as to connect the first chip and the second pad.

According to an embodiment of the present invention, the first groove and the second groove are formed by using through-silicon via (TSV) technology, and the conductive film is formed on the connection groove by using chemical plating technology.

According to another embodiment of the present invention, the second chip further comprises a second metal pad formed on the lower surface of the second chip and connected to the lower opening of the second groove, wherein the first metal pad and the second metal pad are disposed face to face.

According to another embodiment of the present invention, the first chip further comprises a metal pad formed on the lower surface of the first chip and connected to the lower opening of the first groove.

According to another embodiment of the present invention, the first chip further comprises a plurality of third grooves and a plurality of second metal pads. The third grooves are formed on the side surface of the first chip and the second metal pads are formed on the upper surface of the first chip and respectively connected to the upper openings of the third grooves, wherein the second chip further comprises a plurality of fourth grooves formed on the side surface of the second chip. Wherein the third grooves are disposed corresponding to the fourth grooves so as to form a plurality of second connection grooves, and a plurality of conductive films are respectively formed on the second connection grooves and the second metal pads so as to connect the first chip and the second chip.

Form other views, the present invention is directed to a method of fabricating the chip stacked structure, which includes the following steps: first, forming a plurality of metal pads on a plurality of chips respectively; then forming a plurality of grooves corresponding to the metal pads on a side surface of the chips; next stacking the chips for aligning the grooves of the chips; and final forming conductive films on the grooves and the metal pads by using chemical plating technology so as to connect the stacked chips.

In summary, the chip stacked structure and method thereof according to the present invention form the conductive films on the metal pads and the grooves on the side surface by using chemical plating technology. The chip stacked structure may simplify the process and improve the process yield rate.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

(First Embodiment)

Figure 1:
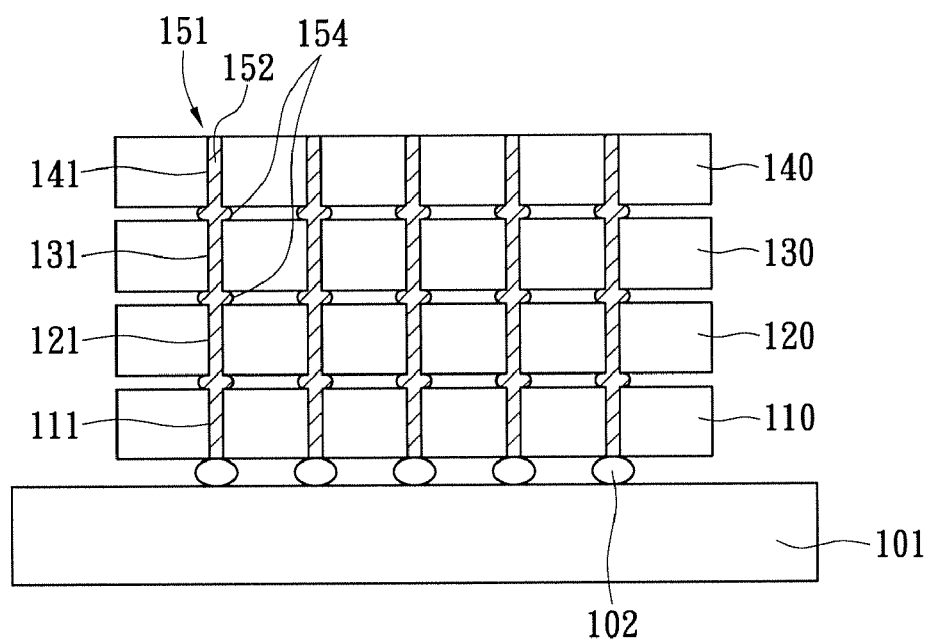
FIG. 1 illustrates a diagram of a chip stacked structure according to a first embodiment of the present invention.
Figure 2:
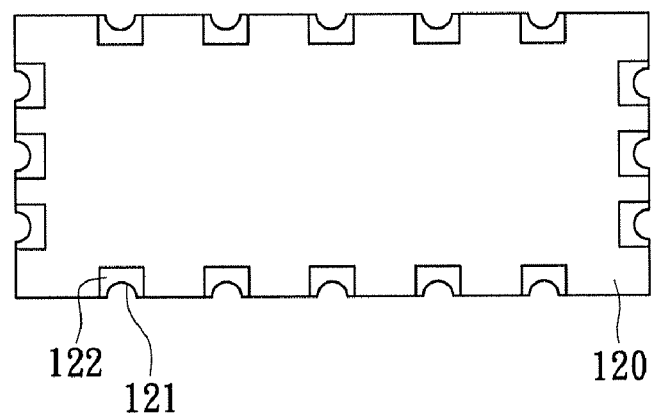
FIG. 2 illustrates a chip structure according to the first embodiment of the present invention is shown.

FIG. 1 illustrates a diagram of a chip stacked structure according to a first embodiment of the present invention. Chips 110~140 are stacked to each other, each of which has grooves 111~141 on the side surface thereof. The grooves 111~141 on the chips 110~140 are disposed corresponding to each other to form a connection groove 151. In the present embodiment, a conductive film 152 is formed on the connection groove 151 by using chemical plating technology, so as to connect the stacked chips. There is provided a metal pad on the upper surface of each chip 110~140 respectively. The grooves 111~141 are formed on a side surface of each chip 110~140 respectively and have locations corresponding to the corresponding metal pad. The process of the grooves 111~141 are for example implemented by using through-silicon via (TSV) technology, but the present invention is not limited thereto. Please also refer to FIG. 2, in which a chip structure according to the first embodiment of the present invention is shown. The chip 120 In FIG. 2 is taken as an example, there are provided metal pads 122 on the upper surface of the chip 120, wherein metal pad 122 is connected to the upper opening of the corresponding groove 121. Since each groove 121 is etched in accordance with the location of the corresponding metal pad 122, the metal pad 122 is located by the edge of the upper opening of the groove 121 and connected to the opening of the corresponding groove 121.

A redistribution layer (RDL) is provide on the upper surface of the chip 120 to provide an electrical connection, in which the metal pads 122 may be connected to each other or be connected to the inner circuit of the chip 120 through the RDL. When completing the stacked structure, the metal pad 122 of the chip 120 may be connected to the chips stacked on or below the chip 120 through the conductive film 152. It is noted that FIG. 2 is merely a diagram of the chip 120, and therefore the disposed location and number of the metal pads 122 of the chip 120 are not limited to FIG. 2. Please refer to FIG. 3, in which the partial structure of the chip 120 is shown. The metal pad 122 is disposed on the upper surface of the chip 120 and located on the edge of the upper opening of the groove 121. The groove 121 is disposed on the side surface of the chip 120 and extends from the upper surface of the chip 120 to the lower surface of the chip 120. The opening of the groove 121 located on the upper surface of the chip 120 is called an upper opening. The opening of the groove 121 located on the lower surface of the chip 120 is called a lower opening. The structures of the chip 110, 130 and 140 are similar to chip 120, and can be deduced by those skilled in the art according to the disclosure of the present invention, so the details will not be described herein again.

Please further refer to FIG. 1, after stacking chips 110~140 is completed, since each of chips 110~140 is provided with a metal pad (e.g. 122) on the top thereof, thus the thickness of the conductive material formed on the metal pad will increase gradually to form the metal connection layer for connecting the stacked chips (e.g. 130 and 140) when the conductive film is formed by using chemical plating technology. The conductive film 152 includes the metal connection layer 154 for connect chips 110~140, so that the chips 110~140 are connected to each other to transmit signals. By using the chemical plating technology, a plurality of conductive films 152 can be formed on the sides of the chips 110~140 in the meanwhile to achieve the electrical connections between the chips 110~140 in the present embodiments.

Figure 4:
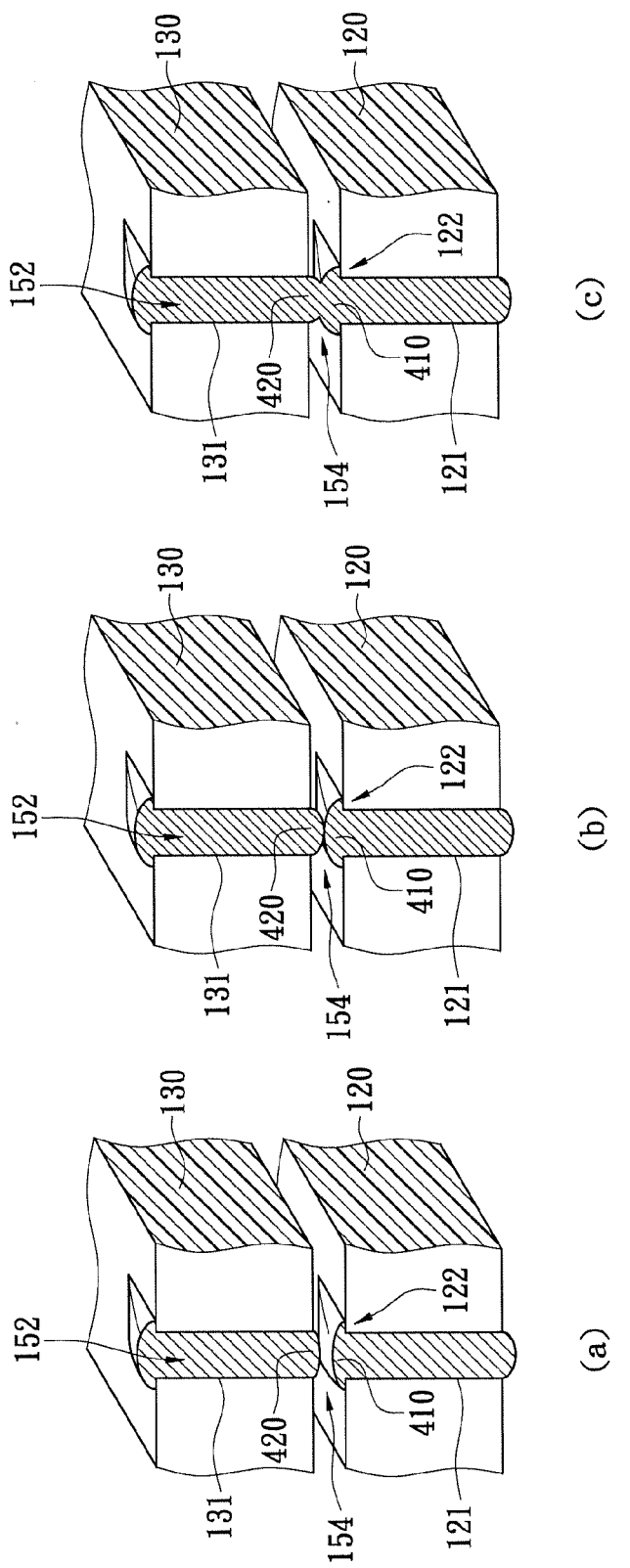
FIG. 4 illustrates a structure diagram of the metal connection layer 154.

The ways of forming the metal connection layer 154 please refer to FIG. 4 which illustrates the structure diagram of the metal connection layer 154. The partial structure of the chips 120 and 130 is illustrates in FIG. 4, wherein the chip 130 is stacked on the upper surface of the chip 120. When performing the plating process, the conductive film 410 is formed on the metal pad 122 and the upper opening of the groove 121, therefore the thickness increase gradually upwards. Meanwhile, the conductive film 420 is formed on the lower opening of the groove 131, and the thickness thereof increases gradually downward as shown in FIG. 4($a$). With increases of the thicknesses of the conductive films 410, 420, the conductive film 410 may connect with the conductive film 420, as shown in FIG. 4($b$). Then, the conductive films 410 and 420 may connect to each other to form the metal connection layer 154, as shown in FIG. 4($c$).

In the present embodiment, since there is provided a metal pad (e.g. 122) on the edge of the opening of each groove (e.g. 121), the conductive film 410 may be formed on the metal pad 122 to connect the stacked chips. Such structure may improve the process for connecting chips, so that the conductive film 152 may effectively connect to each chip 110~140 and the influence of film defects affecting the electrical connection between chips is avoided. The stacked chips 110~140 may be disposed on the printed circuit board (PCB) 101 and the solder balls 102 are provided to connect the chip 110 and the PCB 101, but the positions and number of the solder balls 102 are not limited thereto. The PCB 101 is a substrate, for example a ceramic substrate, a glass substrate or a plastic substrate.

The chip stacked structure in the present embodiment can not only simplify the process, but also improve the yield of the stacked process. The stacked structure of the present embodiment may be applied to a memory device and can significantly increase memory capacity to meet the memory requirements of the high-end cell phones.

(Second Embodiment)

Figure 5:
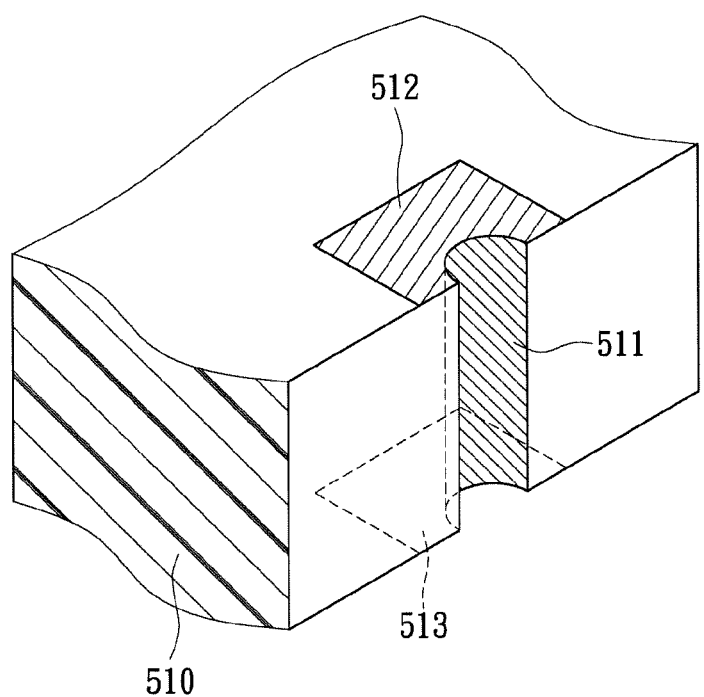
FIG. 5 illustrates a chip stacked structure diagram according to the second embodiment of the present invention.

Please refer to FIG. 5, which illustrates a chip stacked structure diagram according to the second embodiment of the present invention. The chip 510 has a metal pad 512 disposed on the upper surface thereof, a metal pad 513 disposed on the lower thereof and a groove 511 disposed on the side surface thereof. The upper opening of the groove 511 is in the metal pad 512 and the lower opening of the groove 511 is in the metal pad 513. Since there are respectively provided metal pads 512, 513 on the upper surface and the lower surface of the chip 510, when such structure is applied in the stacked chips, there are provided two metal pads on opposite two surfaces of the stacked chips at junction. Such structure may form the metal connection layer quickly to connect the stacked chips. The chip structure in FIG. 5 may directly be applied to chips 110~140 in FIG. 1. Those skilled in the art can deduce the other embodiments according to the disclosure of the present invention, and the description is omitted.

(Third Embodiment)

Figure 3:
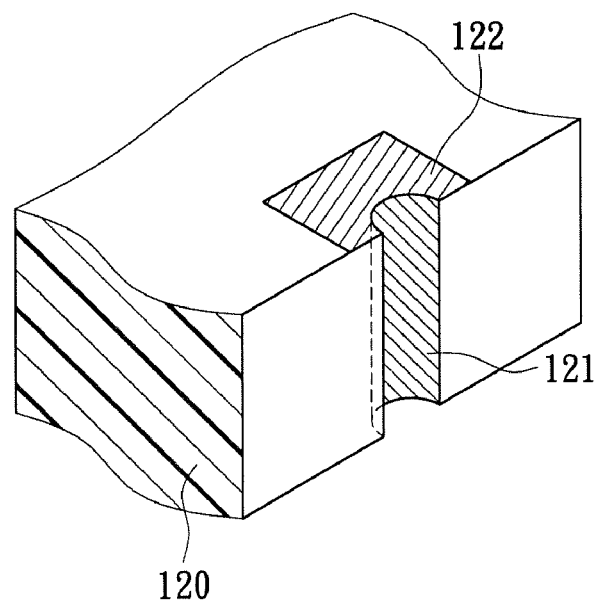
FIG. 3 illustrates the partial structure of the chip 120.
Figure 6:
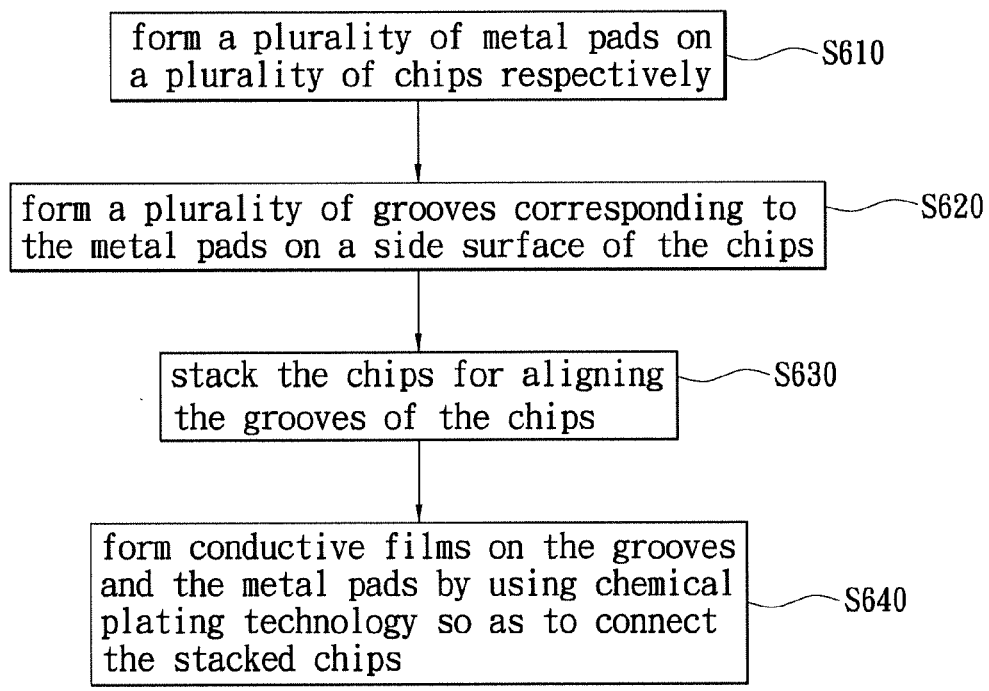
FIG. 6 illustrates a flow chart of chip stacked process according to the third embodiment of the present invention.

Through the aforementioned first and second embodiments, a method of fabricating a chip stacked structure may be summarized. Please refer to FIG. 6, which illustrates a flow chart of chip stacked process according to the third embodiment of the present invention. First, in step S610, metal pads are formed on a plurality of chips respectively, as shown in FIG. 2. Then, in step S620, grooves corresponding to the metal pads are formed on a side surface of the chips, as shown in FIGS. 2 and 3. Next, in step S630, those chips are stacked for aligning the grooves of the chips. In step S640, after stacking the chips is completed, conductive films are formed on the grooves and the metal pads by using chemical plating technology so as to connect the stacked chips, as shown in FIG. 1. The details of the method of the present embodiment please refer to the description of FIG. 1~FIG. 5, and therefore, those skilled in the art can deduce the other embodiments according to the disclosure of the present invention, and the description is omitted.

In summary, the stacked structure has metal pads to facilitate the conductive film growth so as to connect the stacked chips. The structure disclosed in the present invention can simplify the process and improve the yield rate of the stacked structure.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A chip stacked structure, comprising:
   a first chip, having at least one first chip groove and at least one first chip upper metal pad, the at least one first chip groove being formed on a side surface of the first chip and the at least one first chip upper metal pad being formed on an upper surface of the first chip and connected to an upper opening of the at least one first chip groove; and a second chip, stacked on the first chip, having at least one second chip groove formed on a side surface of the second chip, and the second chip having at least one second chip lower metal pad formed on a lower surface of the second chip and connected to a lower opening of the at least one second chip groove, wherein the at least one first chip upper metal pad and the at least one second chip lower metal pad are disposed face to face;

wherein at least one the first chip groove is disposed corresponding to the at least one second chip groove so as to form at least one connection groove, and at least one conductive film is formed on the at least one connection groove and the at least one first chip upper metal pad so as to connect the first chip and the second chip.

2. The chip stacked structure as claimed in claim 1, wherein the at least one first chip groove and the at least one second chip groove are formed by using through-silicon via technology.

3. The chip stacked structure as claimed in claim 1, wherein the at least one conductive film is formed on the at least one connection groove by using chemical plating technology.

4. The chip stacked structure as claimed in claim 1, wherein the first chip further comprises at least one first chip lower metal pad formed on a lower surface of the first chip and connected to a lower opening of the at least one first chip groove.

5. The chip stacked structure as claimed in claim 1, wherein the first chip further comprises:
   a plurality of first chip grooves formed on the side surface of the first chip; and
   a plurality of first chip upper metal pads formed on the upper surface of the first chip and respectively connected to upper openings of the first chip grooves;
wherein the second chip further comprises:
   a plurality of second chip grooves formed on the side surface of the second chip;
   a plurality of second chip lower metal pads formed on the lower surface of the second chip and respectively connected to lower openings of the second chip grooves;
wherein the first chip grooves are disposed corresponding to the second chip grooves so as to form a plurality of connection grooves, and a plurality of conductive films are respectively formed on the connection grooves and the first chip upper metal pads so as to connect the first chip and the second chip.

6. A method of fabricating a chip stacked structure, comprising:
   forming a plurality of metal pads on an upper and lower surface of a plurality of chips respectively;
   forming a plurality of grooves corresponding to the metal pads on a side surface of the chips;
   stacking the chips for aligning the grooves of the chips; and
   forming conductive films on the grooves and the metal pads by using chemical plating technology so as to connect the stacked chips.

* * * * *